United States Patent
Dyer et al.

(10) Patent No.: US 7,485,508 B2
(45) Date of Patent: Feb. 3, 2009

(54) TWO-SIDED SEMICONDUCTOR-ON-INSULATOR STRUCTURES AND METHODS OF MANUFACTURING THE SAME

(75) Inventors: Thomas W. Dyer, Pleasant Valley, NY (US); Haining S. Yang, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 6 days.

(21) Appl. No.: 11/627,653

(22) Filed: Jan. 26, 2007

(65) Prior Publication Data

US 2008/0179678 A1    Jul. 31, 2008

(51) Int. Cl.
*H01L 21/338* (2006.01)
(52) U.S. Cl. .............. 438/154; 438/199; 438/459; 257/E21.415; 257/E27.026
(58) Field of Classification Search ........... 438/197, 438/455, 459, 154, 199; 257/E27.026, E27.027, 257/E27.029, 74, E21.415
See application file for complete search history.

(56) References Cited

U.S. PATENT DOCUMENTS

| | | | | |
|---|---|---|---|---|
| 5,324,980 A * | 6/1994 | Kusunoki | ................ | 257/74 |
| 6,274,982 B1 * | 8/2001 | Scott et al. | ................ | 313/624 |
| 6,525,415 B2 * | 2/2003 | Koyanagi et al. | ........... | 257/686 |
| 6,573,172 B1 * | 6/2003 | En et al. | ................ | 438/626 |
| 7,041,576 B2 * | 5/2006 | Pozder et al. | ................ | 438/458 |
| 7,053,400 B2 * | 5/2006 | Sun et al. | ................ | 257/19 |
| 2005/0167782 A1 * | 8/2005 | Sanchez et al. | ........... | 257/532 |
| 2005/0233493 A1 * | 10/2005 | Augusto | ................ | 438/51 |
| 2007/0184597 A1 * | 8/2007 | Polishchuk et al. | ......... | 438/197 |

* cited by examiner

*Primary Examiner*—Tuan N. Quach
(74) *Attorney, Agent, or Firm*—Scully, Scott, Murphy & Presser, P.C.; H. Daniel Schnurmann

(57) ABSTRACT

Both sides of a semiconductor-on-insulator substrate are utilized to form MOSFET structures. After forming first type devices on a first semiconductor layer, a handle wafer is bonded to the top of a first middle-of-line dielectric layer. A lower portion of a carrier substrate is then removed to expose a second semiconductor layer and to form second type devices thereupon. Conductive vias may be formed through the buried insulator layer to electrically connect the first type devices and the second type devices. Use of block masks is minimized since each side of the buried insulator has only one type of devices. Two levels of devices are present in the structure and boundary areas between different types of devices are reduced or eliminated, thereby increasing packing density of devices. The same alignment marks may be used to align the wafer either front side up or back side up.

20 Claims, 8 Drawing Sheets

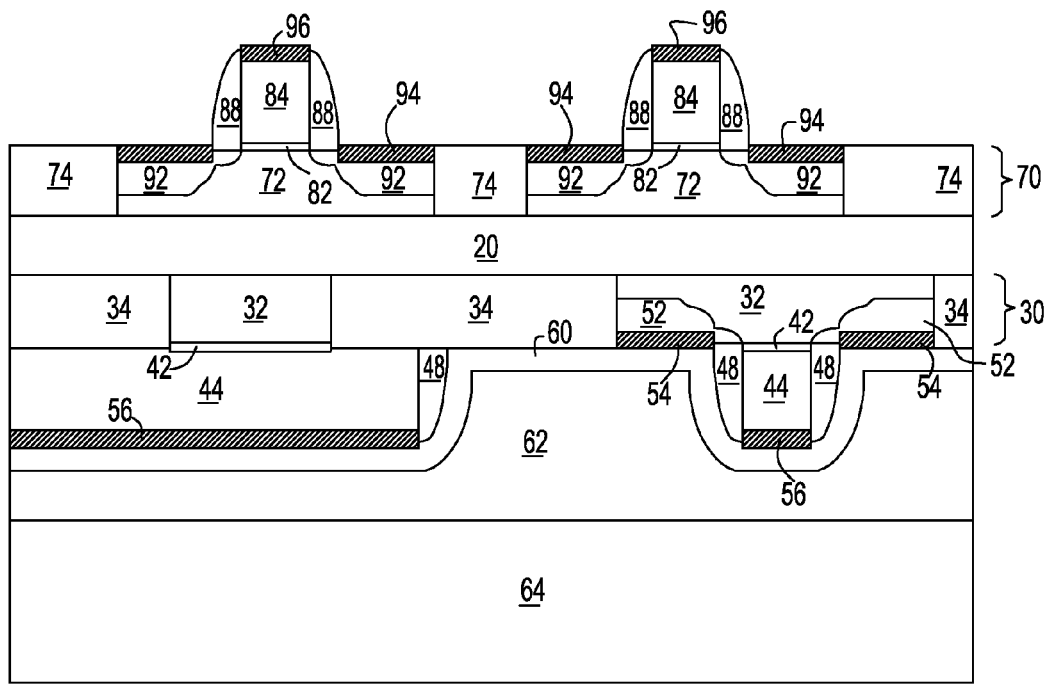
FIG. 11
FIG. 12
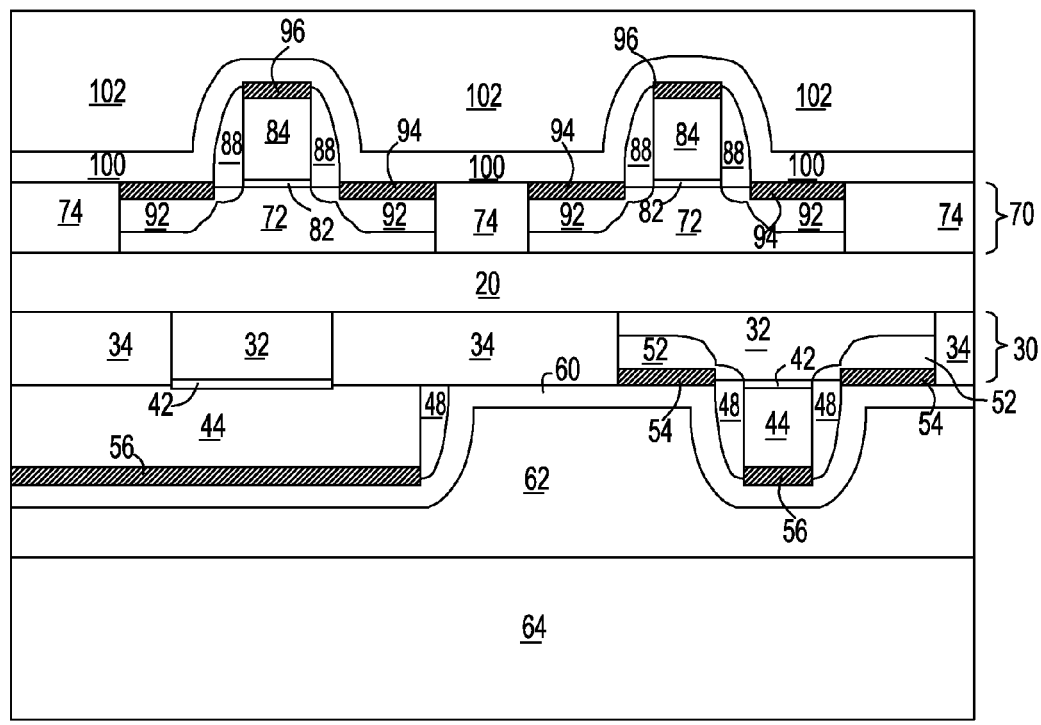

TWO-SIDED SEMICONDUCTOR-ON-INSULATOR STRUCTURES AND METHODS OF MANUFACTURING THE SAME

FIELD OF THE INVENTION

The present invention relates to semiconductor devices, and particularly to semiconductor structures having semiconductor devices on both sides of a semiconductor-on-insulator substrate and methods of fabricating the same.

BACKGROUND OF THE INVENTION

Conventional complementary metal oxide semiconductor (CMOS) integrated circuits comprise p-type devices and n-type devices formed on the same level in a semiconductor substrate, i.e., the various components of p-type devices are coplanar with the corresponding components of the n-type devices. Some of the processing steps are common to both the p-type devices and the n-type devices, but many steps are not common and thus need to be performed separately by masking the area for one type of device while processing the other type of device. For example, the p-type and n-type devices require different well implantation, different gate polysilicon implantation, and different source and drain implantation.

For common processing steps, the processing conditions are in general not optimal for either the p-type devices or for the n-type devices, but instead a compromise between the two different optimal conditions is made. For example, the stress of shallow trench isolation cannot be simultaneously optimized for both p-type devices and n-type devices since an optimal stress for a p-type metal-oxide-semiconductor field effect transistor (MOSFET) is compressive, while an optimal stress for an n-type MOSFET is tensile. The structure of a gate stack is another example in which different processes between the p-type and n-type devices can improve the performance of both types of MOSFETs.

A consequence of forming both types of semiconductor devices on the same level is the formation of a boundary area between the two types of devices. Due to a finite overlay tolerance of the block masks, the boundary area needs to be at least as wide as the overlay tolerance of the block masks. Since p-type devices and n-type devices need to be placed in proximity, the boundary area may occupy a substantial portion of the total semiconductor area in high performance CMOS circuits. Furthermore, requirements for inter-well isolation also increase the boundary area between the two types of semiconductor devices.

In general, one group of high performance CMOS devices requires using a particular type of material and processing steps, while another group of high performance CMOS devices require using a different type of material and processing steps. At the same time, the two groups of high performance CMOS devices need to be physically placed in close proximity to facilitate wiring and to reduce delay in signal propagation. Use of block masks not only increases the process complexity and cost, but also reduces the packing density due to the requirement for boundary areas between the two groups of devices.

Therefore, there exists a need for a novel semiconductor structure and methods of manufacturing the same in which a first group of CMOS devices are subjected to a first type of processing, while a second group of CMOS devices are subjected to a second type of processing without using block masks that mask one group of devices while exposing the other group.

Furthermore, there exists a need for a semiconductor structure and methods of manufacturing the same in which the two groups of semiconductor devices are placed in proximity and may be wired locally with minimal length wiring distances.

SUMMARY OF THE INVENTION

The present invention addresses the needs described above by providing a semiconductor structure with at least one first type semiconductor device located above a buried insulator layer of a semiconductor-on-insulator (SOI) substrate and with at least one second type semiconductor device located beneath the buried insulator layer of the SOI substrate.

Further, the present invention addresses the needs described above by providing a method of manufacturing a semiconductor structure by forming the at least one first type semiconductor device above a buried insulator layer of a semiconductor-on-insulator (SOI) substrate and by forming the at least one second type semiconductor device beneath the buried insulator layer of the SOI substrate.

According to the present invention, a semiconductor structure comprises:

a buried insulator layer;

at least one first type MOSFET located on a first semiconductor layer, wherein the first semiconductor layer directly contracts a bottom surface of the buried insulator layer; and at least one second type MOSFET located on a second semiconductor layer, wherein the second semiconductor layer directly contacts a top surface of the buried insulator layer.

The semiconductor structure according to the present invention may further comprise:

a first middle-of-line (MOL) dielectric layer located on the at least one first type MOSFET; and a handle wafer bonded to the first MOL dielectric layer.

The materials and process parameters for the at least one first type MOSFET and the at least one second type MOSFET may be independently optimized. Such materials and process parameters include surface orientations of the first and second semiconductor layers, the material for shallow trench isolation (STI) and consequent stresses applied to devices by the STI, stress liners on the first type and second type MOSFETs, semiconductor material for the first and second semiconductor layers, embedded material within source and drain regions of the MOSFETs and consequent stresses applied to the channel of the two types of MOSFETs, gate electrode materials for the gate dielectric layers and/or the gate conductors.

The semiconductor structure according to the present invention may further comprise an alignment structure that allows alignment of the semiconductor structure both with the top semiconductor layer on the upside of the buried insulator layer and with the bottom semiconductor layer on the upside of the buried insulator layer.

The semiconductor structure according to the present invention may further comprise:

a second middle-of-line (MOL) dielectric layer located on the at least one second type MOSFET; and at least one conductive via through the second MOL dielectric layer, through the second semiconductor layer, and through the buried insulator layer.

Preferably, the semiconductor structure further comprises at least one metal wiring that contacts the at least one conductive via and the second MOL dielectric layer.

According to the present invention, a method of manufacturing the semiconductor structure described above comprises:

providing a semiconductor-on-insulator (SOI) substrate with a carrier substrate, a buried insulator layer, and a first semiconductor layer;

forming at least one first type MOSFET on the first semiconductor layer;

forming a first middle-of-line (MOL) dielectric layer on the at least one first type MOSFET;

bonding a handle wafer on the first MOL dielectric layer;

removing a lower portion of the carrier substrate and exposing a second semiconductor layer; and forming at least one second type MOSFET on the second semiconductor layer.

According to the present invention, the method of manufacturing the semiconductor structure described above may further comprise:

forming a second middle-of-line (MOL) dielectric layer on the at least one second type MOSFET; and forming at least one conductive via through the second MOL dielectric layer, through the second semiconductor layer, and through the buried insulator layer.

Preferably, the method of manufacturing the semiconductor structure further comprises forming at least one metal wiring that contacts the at least one conductive via and the second MOL dielectric layer.

Also preferably, the method of manufacturing the semiconductor structure further comprises:

forming at least one alignment mark at least within the first semiconductor layer; and aligning the second semiconductor layer utilizing the at least one alignment mark.

According to the present invention, the first type semiconductor devices and the second type semiconductor devices are formed separately. Therefore, different materials and different process parameters may be utilized to optimize the performance of the first type MOSFETs and the second type MOSFETs independently. The optimization of the device performance is not necessarily limited to MOSFET devices, but may be extended to any other semiconductor devices including passive devices such as resistors, capacitors, diodes, and varactors.

Any process parameters and materials may therefore be utilized to optimize the semiconductor devices on the first semiconductor layer and the semiconductor devices on the second semiconductor layer independently including the materials and process parameters listed above.

BRIEF DESCRIPTION OF THE DRAWINGS

FIGS. 1, 2, 2A, 2B, 3-8, 8A, 8B, and 9-13 are sequential vertical cross-sectional views illustrating the basic processing steps for manufacturing an exemplary semiconductor structure according to the present invention.

DETAILED DESCRIPTION OF THE INVENTION

As stated above, the present invention relates to a semiconductor structure and methods of manufacturing the same, in which first type semiconductor devices are formed on one side of a buried insulator layer and second type semiconductor devices are formed on the other side of the buried insulator layer, which is now described in detail with accompanying figures.

Figure 1:
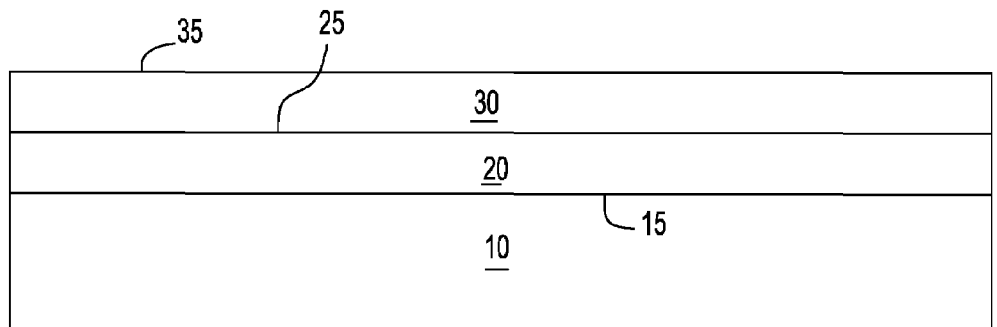

Referring to FIG. 1, a semiconductor-on-insulator (SOI) substrate is provided. The SOI substrate comprises a carrier substrate 10, a buried insulator layer 20, and a first semiconductor layer 30. Since the SOI substrate is later flipped upside down, the first semiconductor layer 30 is physically located beneath the buried insulator layer 20 in the final structure. For this reason, the first interface 25 between the buried insulator layer 20 and the first semiconductor layer 30 is herein referred to as a "bottom surface" of the buried insulator layer 20. For a similar reason, the second interface 15 between the buried insulator layer 20 and the carrier substrate 10 is herein referred to as a "top surface" of the buried insulator layer 20. The first semiconductor layer 30 has an exposed first surface 35 with a first surface orientation, which is the crystallographic orientation of the first semiconductor layer 30 in the direction of the surface normal of the first surface 35. Similarly, the carrier substrate 10 has an exposed second surface 5 with a second surface orientation, which is the crystallographic orientation of the carrier substrate 10 in the direction of the surface normal of the second surface 5. The surface orientations of the first semiconductor layer 30 and of the carrier substrate 10, respectively, refer to the first surface orientation and to the second surface orientation.

The semiconductor material of the first semiconductor layer 30 is optimized for performance of at least one first type MOSFET to be subsequently formed thereupon. The semiconductor material in the carrier substrate 10 is optimized for performance of at least one second type MOSFET. Therefore, the semiconductor material in the first semiconductor layer 30 and the semiconductor material in the carrier substrate 10 may be the same or may be different. Similarly, the crystallographic orientations, and especially the surface orientations, which is the crystallographic orientations of the surface normal of a semiconductor layer, may be the same or different between the first semiconductor layer 30 and the carrier substrate 10.

Non-limiting examples of semiconductor material comprising each of the first semiconductor layer 30 and the carrier substrate 10 may be one of the following: silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Non-limiting examples of surface orientations for the first semiconductor layer 30 and for the carrier substrate 10 include (100), (110), (111), (211), (221), (311), (321), and (331). Any combination of semiconductor material and surface orientation may be employed to optimize device performance for each of the at least one first type MOSFET and the at least one second type MOSFET.

Figure 2:
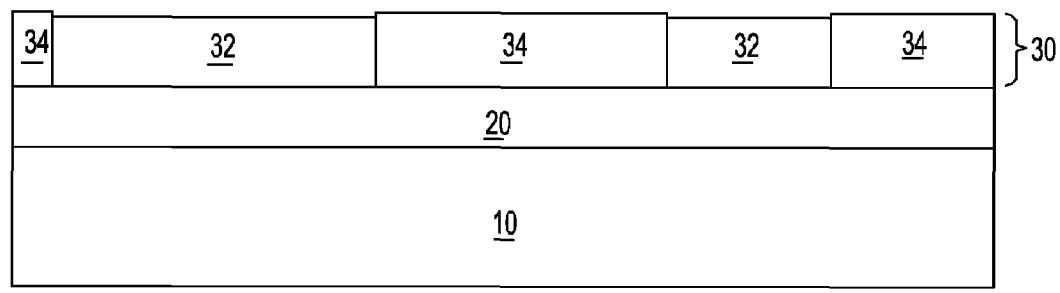

Referring to FIG. 2, first shallow trench isolation (STI) 34 is formed within the first semiconductor layer 30 by conventional methods such as deposition of pad layers, lithographic patterning of the pad layers, deposition of a first STI material, and planarization. The remaining portions of the first semiconductor layer 30 that are not occupied by the first STI 34 form first active areas 32. The first STI material may be selected to apply optimal stress to the first active areas 32 for the at least one first type MOSFET to be formed thereupon. For example, if the at least one first type MOSFET to be formed in the first semiconductor layer 30 is a p-type MOSFET, the first STI may apply a compressive stress to the first active areas 32. If the at least one first type MOSFET to be formed in the first semiconductor layer 30 is an n-type MOSFET, the first STI may apply a tensile stress to the first active areas 32. Suitable STI liners may be employed as needed. Some of the first STI 34 may be used to form alignment marks that may be used to align a semiconductor structure on the first semiconductor layer 30 and subsequently to align a semiconductor structure to be formed on a remaining portion of the carrier substrate 10 after removing a portion of the carrier substrate 10 and flipping the semiconductor structure upside down.

Figure 2A:
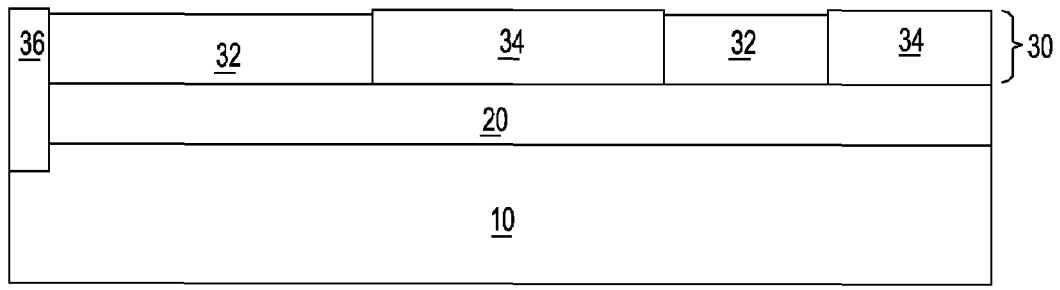

Referring to FIG. 2A, a first alternative semiconductor structure with a first alternative alignment mark 36 is shown which is formed by etching the first semiconductor layer 30, the buried insulator layer 20, and a portion of the carrier substrate 10. The depth of the first alternative alignment mark 36 is selected such that the first alternative alignment mark 36 does not extend to the surface of a remaining portion of the carrier substrate 10 after removing a portion of the carrier substrate as will be shown below.

Figure 2B:
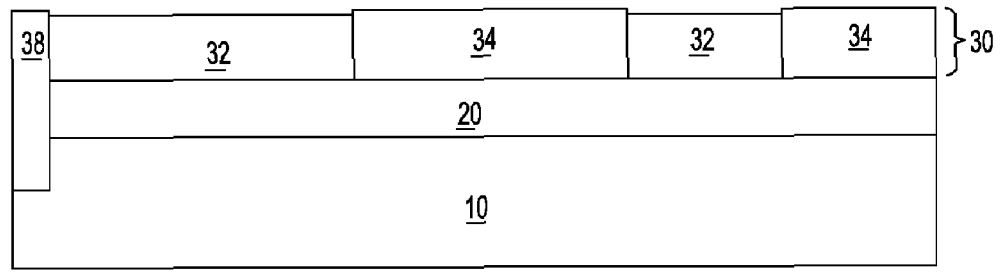

Referring to FIG. 2B, a second alternative semiconductor structure with a second alternative alignment mark 38 is shown which is formed by etching the first semiconductor layer 30, the buried insulator layer 20, and a portion of the carrier substrate 10. The depth of the second alternative alignment mark 38 is selected such that the second alternative alignment mark 38 extends to the surface of a remaining portion of the carrier substrate 10 after removing a portion of the carrier substrate as will be shown below.

Figure 3:
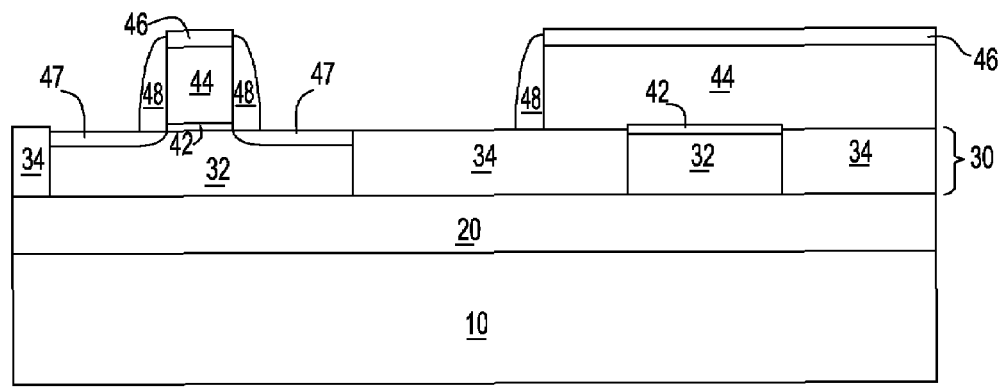

Referring to FIG. 3, at least one first type MOSFET is partially formed by depositing a first gate stack, lithographically patterning the first gate stack, and forming suitable first spacers 48 as well as implantation of suitable dopants. Unlike standard CMOS processing that utilizes various block masks to block one type of devices while process the other, block masks are not needed to differentiate one type of devices from another since the present invention allows the formation of one type of devices on one side of the buried insulator layer 20. Devices of the other type are subsequently formed on the other side of the buried insulator layer 20. For example, a first gate stack that comprises a first gate dielectric layer 42, a first gate conductor layer 44, and a first gate cap layer 46 are formed on the first semiconductor layer 30. The first gate stack (42, 44, 46) is subsequently lithographically patterned and etched to form first gate electrodes. First source and drain extension regions 47 may be formed by suitable implantation. The first spacers 48 are formed as needed by deposition of a first dielectric layer followed by a reactive ion etch (RIE).

The first gate dielectric layer 42, the first gate conductor layer 44, and the first gate cap layer 46 are optimized for the performance of the at least one first type MOSFET with disregard to considerations for performance of the at least one second type MOSFET to be formed subsequently. In other words, materials and process parameters for the components of the first gate stack (42, 44, 46) may be optimized only for the performance of the at least one first type MOSFET. For example, a high-K dielectric material and a metal gate material suitable for the at least one first type MOSFET may be utilized for the first gate stack (42, 44, 46). In another example, if polysilicon is employed in the first gate stack, the polysilicon may be in-situ doped at an optimal level for the at least one first type MOSFET.

Figure 4:
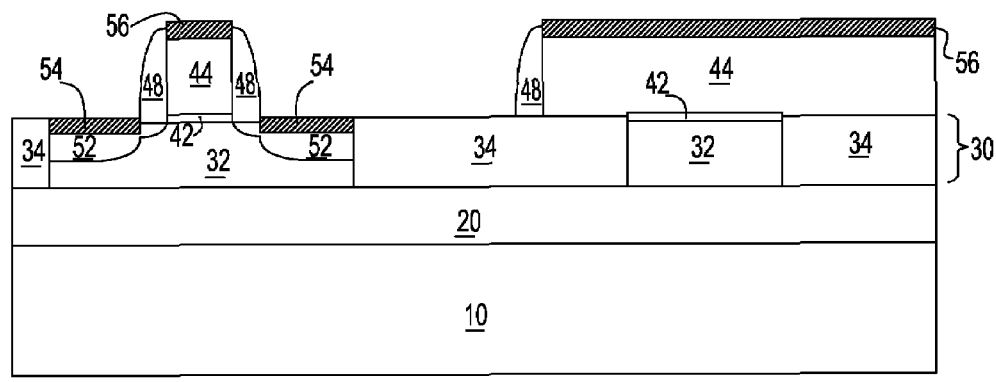

Referring to FIG. 4, first source and drain regions 52 are formed by ion implantation. Optionally, a first embedded material may be formed within the first source and drain regions 52 either by implantation of additional material followed by an anneal or by etching of at least a portion of the first source and drain region 52 followed by deposition of the first embedded material. Implantation into the first gate conductor layer 44 may be performed as needed. The first gate cap layer 46 is removed prior to a first silicidation. After appropriate surface preparations such as a wet etch, a first metal (not shown) is deposited and reacted with underlying semiconductor materials to form a first source and drain silicide 54 and a first gate silicide 56. Process parameters for the first metal, such as composition, deposited thickness, and deposition method as well as process parameters for the metallization such as anneal temperatures and duration of the anneal process, which are well known in the prior art, are optimized for the performance of the at least one first type MOSFET with disregard to considerations for performance of at least one second type MOSFET to be formed subsequently. In other words, materials and process parameters for the components of the first source and drain silicide 54 and the first gate silicide 56 may be optimized only for the performance of the at least one first type MOSFET.

Figure 5:
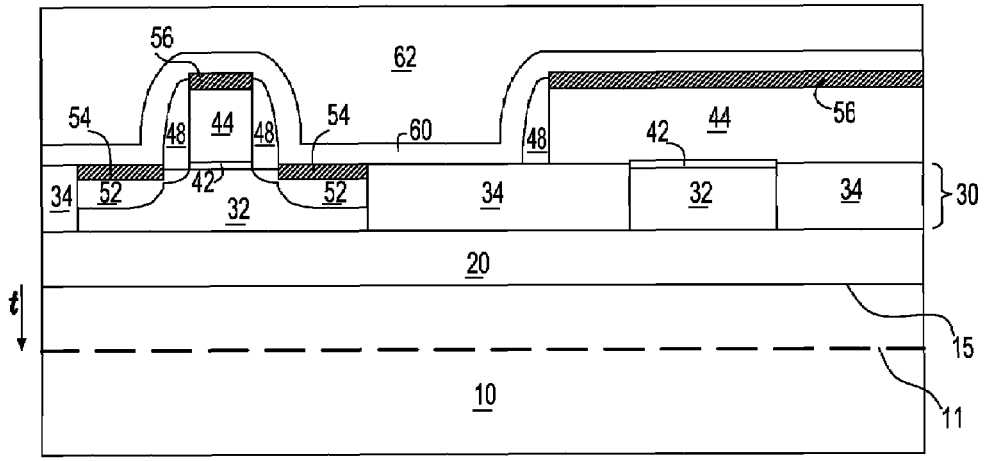

Referring to FIG. 5, a first stress liner 60 may be formed directly on the at least one first type MOSFET. Preferably, a first stress liner 60 is a dielectric layer that applies a stress to the channel of the at least one first type MOSFET such that the minority carrier mobility is enhanced in the channel of the at least one first type MOSFET. For example, if the at least one first type MOSFET comprises a p-type MOSFET, the first stress liner 60 preferably applies a compressive stress to the channel of the at least one first type MOSFET. If the at least one first type MOSFET comprises an n-type MOSFET, the first stress liner 60 preferably applies a tensile stress to the channel of the at least one first type MOSFET. Thereafter, a first middle-of-the-line (MOL) dielectric layer 62 is deposited and planarized. The first MOL dielectric layer 62 may be a doped or undoped oxide. The first MOL dielectric layer 62 may or may not apply stress to the channel of the at least one first type MOSFET. The material and process parameters for the first MOL dielectric layer 62, which are well known in the prior art, are optimized for the performance of the at least one first type MOSFET.

After planarization of the first MOL dielectric layer 62, a hydrogen implant may be performed into the carrier substrate 10 to facilitate a subsequent cleaving of the carrier substrate 10. The depth of the hydrogen implant 11 as measured from the second interface 15 between the carrier substrate 10 and the buried insulator layer 20 determines the thickness t of the remaining semiconductor layer (to be referred to as a "second semiconductor layer" subsequently) after cleaving. Alternative methods for removing a portion of the carrier substrate 11 without employing a hydrogen implantation may also be utilized, in which case a hydrogen implantation at this stage is not necessary.

Figure 6:
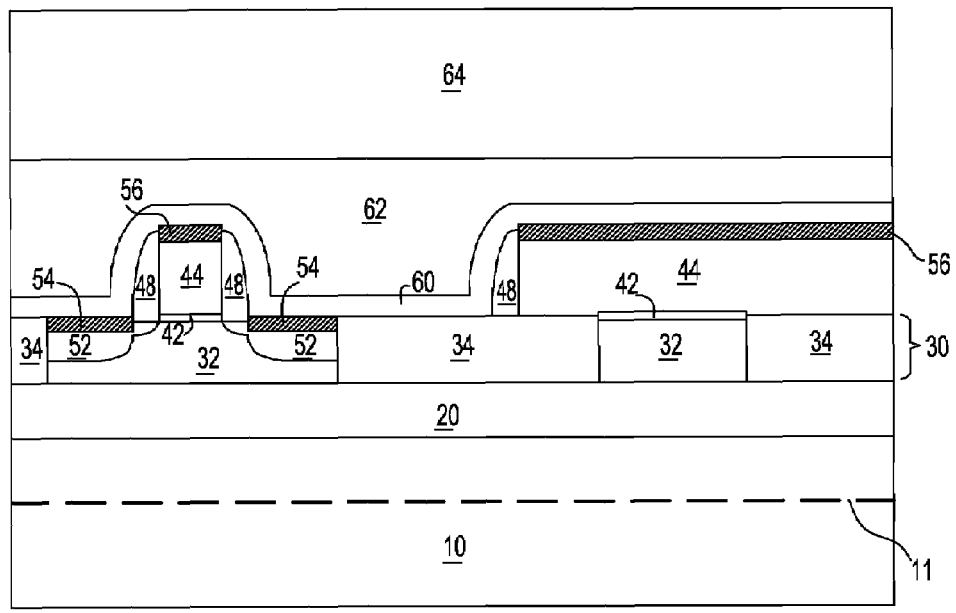

Referring to FIG. 6, a handle wafer 64 is bonded to the planarized first MOL layer 62. The handle wafer 64 may comprise a semiconductor material, a conducting material, or an insulating material. The handle wafer 64 may be bonded at a low temperature, e.g., below 500° C. to avoid cleaving of the carrier substrate 10 if a hydrogen implant is used prior to bonding.

Figure 7:
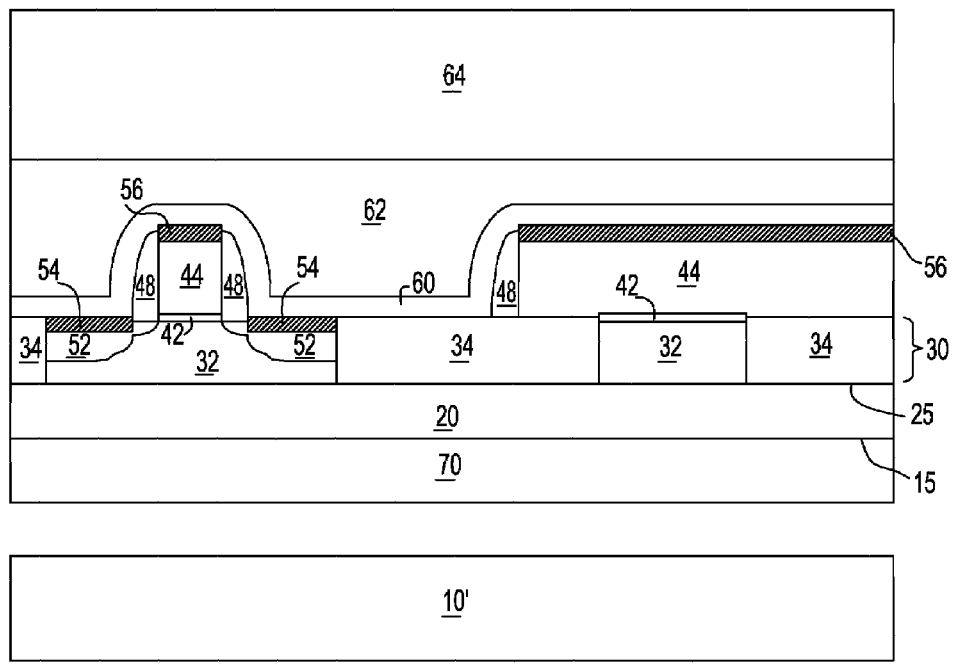

Referring to FIG. 7, a lower portion 10' of the carrier substrate 10 is removed preferably by cleaving the lower portion 10' from the rest of the semiconductor structure. If a hydrogen implant is used prior to bonding of the handle wafer 64 with the planarized first MOL dielectric layer 62 and a low temperature bonding, i.e., at a temperature below 500° C., is utilized during the bonding, the cleaving is performed by subjecting the semiconductor structure to a temperature above 500° C. to facilitate cleaving.

Alternatively, the bonding of the handle wafer 64 with the planarized first MOL dielectric 62 and the cleaving of the carrier substrate 10 into a lower portion 10' and the second semiconductor layer 70 may be performed at the same time at a temperature above 500° C.

If a hydrogen implant is not used, the lower portion 10' of the carrier substrate 10 may be removed by other methods such as chemical mechanical planarization.

The second semiconductor layer 70 is the remaining portion of the carrier substrate 10 after cleaving. The interface between the second semiconductor layer 70 and the buried insulator layer 20 is the same interface between the original carrier substrate 10 and the buried insulator layer 20, which is the second interface 15, or the "top surface" of the buried insulator layer 20 as shown in FIG. 7.

Figure 8:
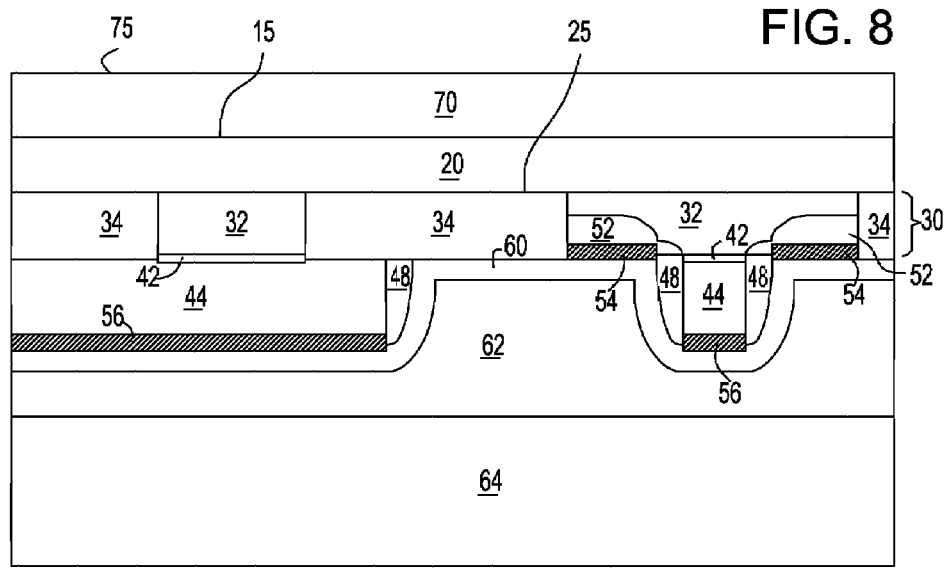

Referring to FIG. 8, the remaining semiconductor structure that comprises the buried insulator layer 20 is flipped upside down. The second interface 15, or the "top surface" of the buried insulator layer 20 is now located at the "top" of the buried insulator layer 20. Likewise, the first interface 25, or the "bottom surface" of the buried insulator layer 20 is now located at the "bottom" of the buried insulator layer 20. The surface orientation of the second semiconductor layer 70 is the orientation of the surface normal of the second semiconductor layer surface 75 and is the same as the second surface orientation, which is the surface orientation of the carrier substrate 10 prior to cleaving.

Alignment marks formed in the first STI 34 may be used to align the semiconductor structure after flipping the semiconductor structure upside down. Preferably, multiple alignment marks are utilized for precise alignment of structures in the second semiconductor layer 70 in subsequent processing steps.

Figure 8A:
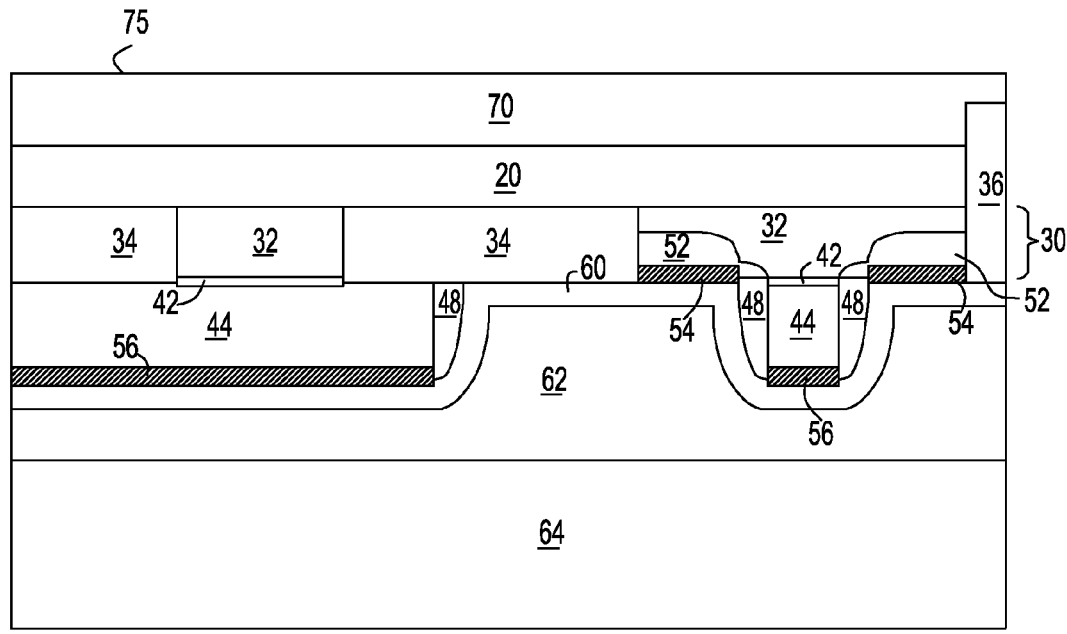

Referring to FIG. 8A, the first alternative semiconductor structure with a first alternative alignment mark 36, as shown in FIG. 2A above, is shown at the stage of semiconductor processing corresponding to FIG. 8. The first alternative alignment mark 36 does not extend to the second semiconductor layer surface 75. Preferably, multiple first alternative alignment marks 36 are utilized for precise alignment of structures in the second semiconductor layer 70 in subsequent processing steps.

Figure 8B:
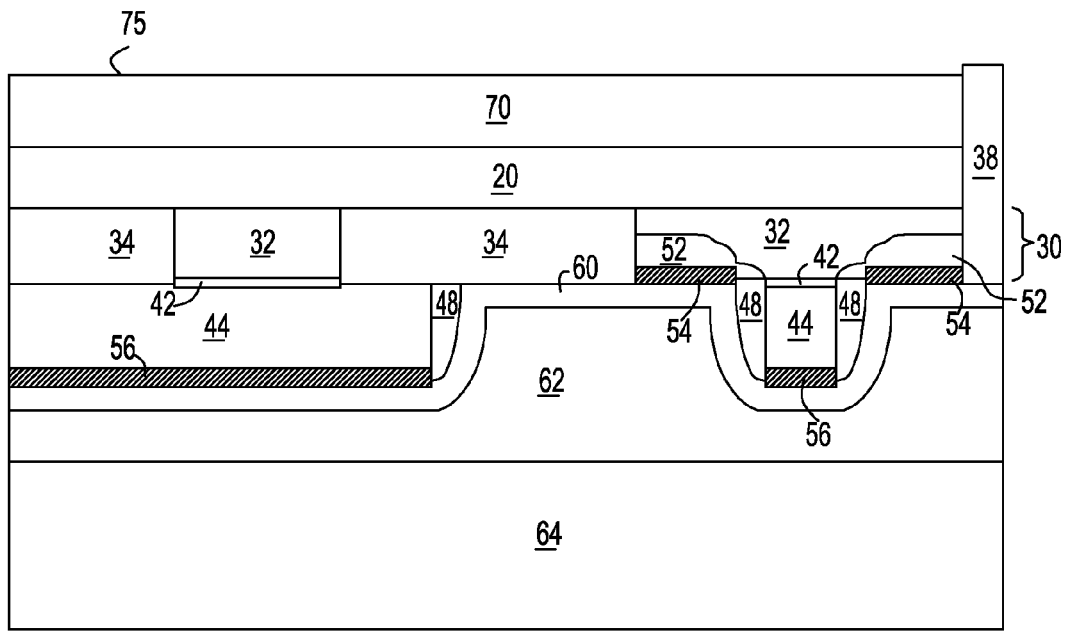

Referring to FIG. 8B, the second alternative semiconductor structure with a second alternative alignment mark 38, as shown in FIG. 2B above, is shown at the stage of semiconductor processing corresponding to FIG. 8. The second alternative alignment mark 38 extends to the second semiconductor layer surface 75. Preferably, multiple second alternative alignment marks 38 are utilized for precise alignment of structures in the second semiconductor layer 70 in subsequent processing steps.

Figure 9:
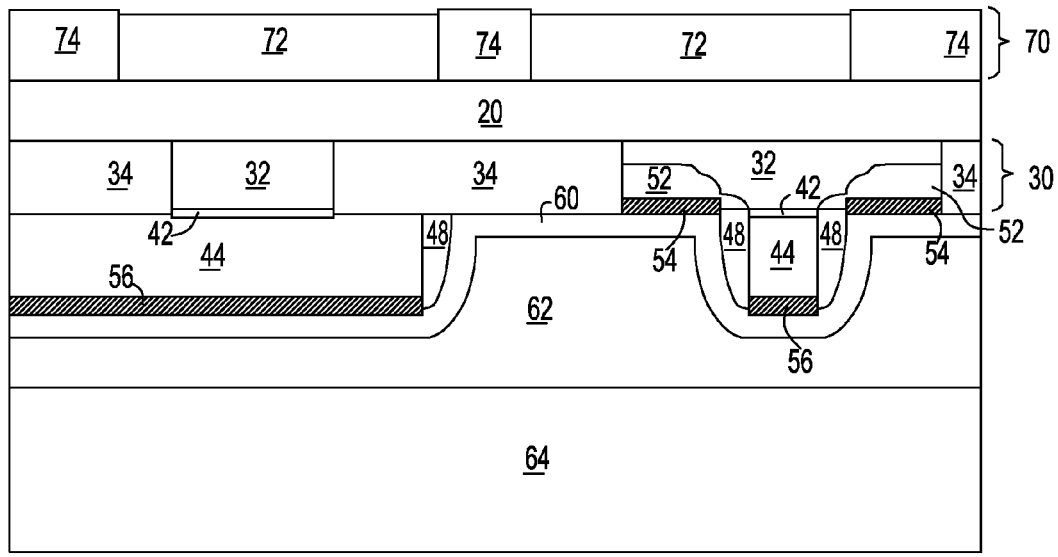

Referring to FIG. 9, second shallow trench isolation (STI) 74 is formed within the second semiconductor layer 70 by conventional methods such as deposition of pad layers, lithographic patterning of the pad layers, deposition of a second STI material, and planarization. The remaining portions of the second semiconductor layer 70 that are not occupied by the second STI 74 form second active areas 72. The second STI material may be selected to apply optimal stress to the second active areas 72 for the at least one second type MOSFET to be formed thereupon. For example, if the at least one second type MOSFET to be formed in the second semiconductor layer 70 is an n-type MOSFET, the second STI may apply a tensile stress to the second active areas 72. If the at least one second type MOSFET to be formed in the second semiconductor layer 30 is a p-type MOSFET, the second STI may apply a compressive stress to the second active areas 32. Suitable STI liners may be employed as needed. The first STI material and the second STI material may be the same or different.

Figure 10:
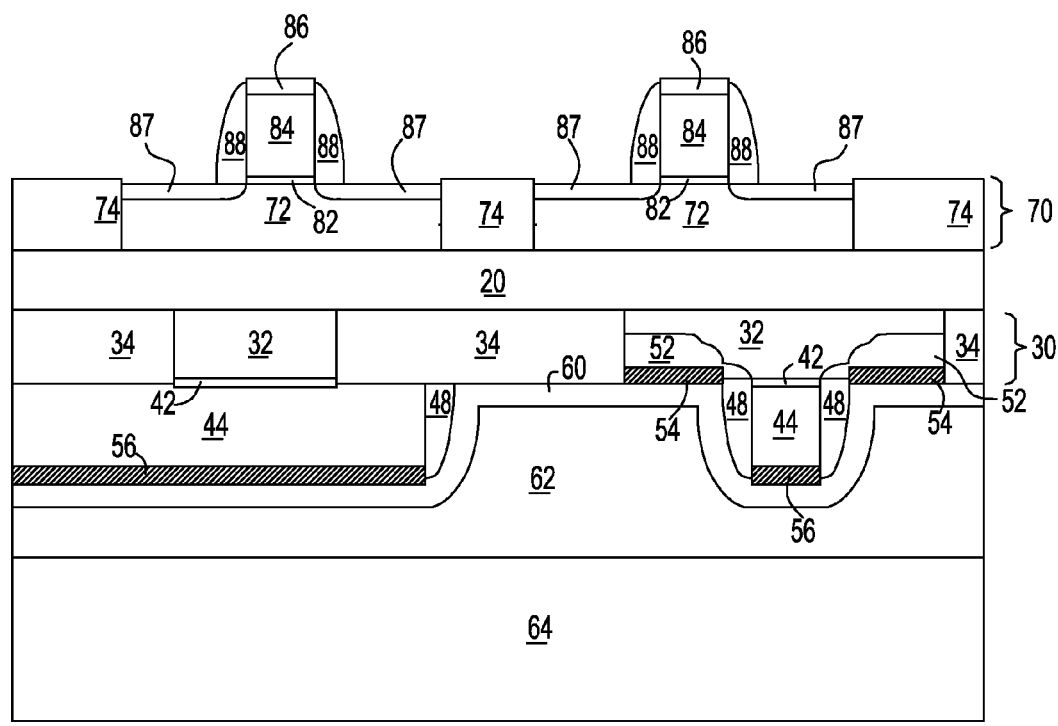

Referring to FIG. 10, at least one second type MOSFET is partially formed by depositing a second gate stack, lithographically patterning the second gate stack, and forming suitable second spacers 88 as well as implantation of suitable dopants. Unlike standard CMOS processing that utilizes various block masks to block one type of devices while process the other, block masks are not needed to differentiate one type of devices from another since the present invention allows the formation of one type of devices on one side of the buried insulator layer 20, that is on the first semiconductor layer 30, while forming the other type of devices on the other side of the buried insulator layer 20, that is, on the second semiconductor layer 70. For example, a second gate stack that comprises a second gate dielectric layer 82, a second gate conductor layer 84, and a second gate cap layer 86 are formed on the second semiconductor layer 70. The second gate stack (82, 84, 86) is subsequently lithographically patterned and etched to form second gate electrodes. The composition of the first gate stack (42, 44, 46) may be the same as or may be different from the composition of the second gate stack (82, 84, 86). Preferably, the composition of the first gate stack (42, 44, 46) is different from the composition of the second gate stack (82, 84, 86) to optimize the performance of the at least one first type MOSFET and the at least one second type MOSFET independently. Second source and drain extension regions 87 may be formed by suitable implantation. The second spacers 88 are formed as needed by deposition of a second dielectric layer followed by a reactive ion etch (RIE). The material for the first spacers 48 and the material for the second spacers 88 may be the same or different.

The second gate dielectric layer 82, the second gate conductor layer 84, and the second gate cap layer 86 are optimized for the performance of the at least one second type MOSFET with disregard to considerations for performance of at least one first type MOSFET that has been formed before except for the impact of thermal cycling on the thermal diffusion of dopants in the at least one first type MOSFET. In other words, materials and process parameters for the components of the second gate stack (82, 84, 86) may be optimized only for the performance of the at least one second type MOSFET. For example, a high-K dielectric material and a metal gate material suitable for the at least one second type MOSFET may be utilized for the second gate stack (82, 84, 86). In another example, if polysilicon is employed in the second gate stack, the polysilicon may be in-situ doped at an optimal level for the at least one second type MOSFET.

Referring to FIG. 11, second source and drain regions 92 are formed by ion implantation. Optionally, a second embedded material may be formed within the second source and drain regions 92 either by implantation of additional material followed by an anneal or by etching of at least a portion of the second source and drain region 92 followed by deposition of a second embedded material. Implantation into the second gate conductor layer 84 may be performed as needed. The second gate cap layer 86 is removed prior to a second silicidation. After appropriate surface preparations such as a wet etch, a second metal (not shown) is deposited and reacted with underlying semiconductor materials to form a second source and drain silicide 94 and a second gate silicide 96. Process parameters for the second metal, such as composition, deposited thickness, and deposition method as well as process parameters for the metallization such as anneal temperatures and duration of the anneal process are optimized for the performance of the at least one second type MOSFET with disregard to considerations for performance of at least one second type MOSFET that has been formed before except for the impact of thermal cycling on the thermal diffusion of dopants in the at least one first type MOSFET. In other words, materials and process parameters for the components of the second source and drain silicide 94 and the second gate silicide 96 may be optimized only for the performance of the at least one second type MOSFET.

Referring to FIG. 12, a second stress liner 100 may be formed directly on the at least one second type MOSFET. Preferably, a second stress liner 100 is a dielectric layer that applies a stress to the channel of the at least one second type MOSFET such that the minority carrier mobility is enhanced in the channel of the at least one second type MOSFET. For example, if the at least one second type MOSFET comprises an n-type MOSFET, the second stress liner 100 preferably applies a tensile stress to the channel of the at least one second type MOSFET. If the at least one second type MOSFET comprises a p-type MOSFET, the second stress liner 100 preferably applies a compressive stress to the channel of the at least one second type MOSFET. Thereafter, a second middle-of-the-line (MOL) dielectric layer 102 is deposited and planarized. The second MOL dielectric layer 102 may be a doped or undoped oxide. The second MOL dielectric layer may or may not apply stress to the channel of the at least one second type MOSFET. The material and process parameters for the second MOL dielectric layer 102 are optimized for the performance of the at least one second type MOSFET.

Figure 13:
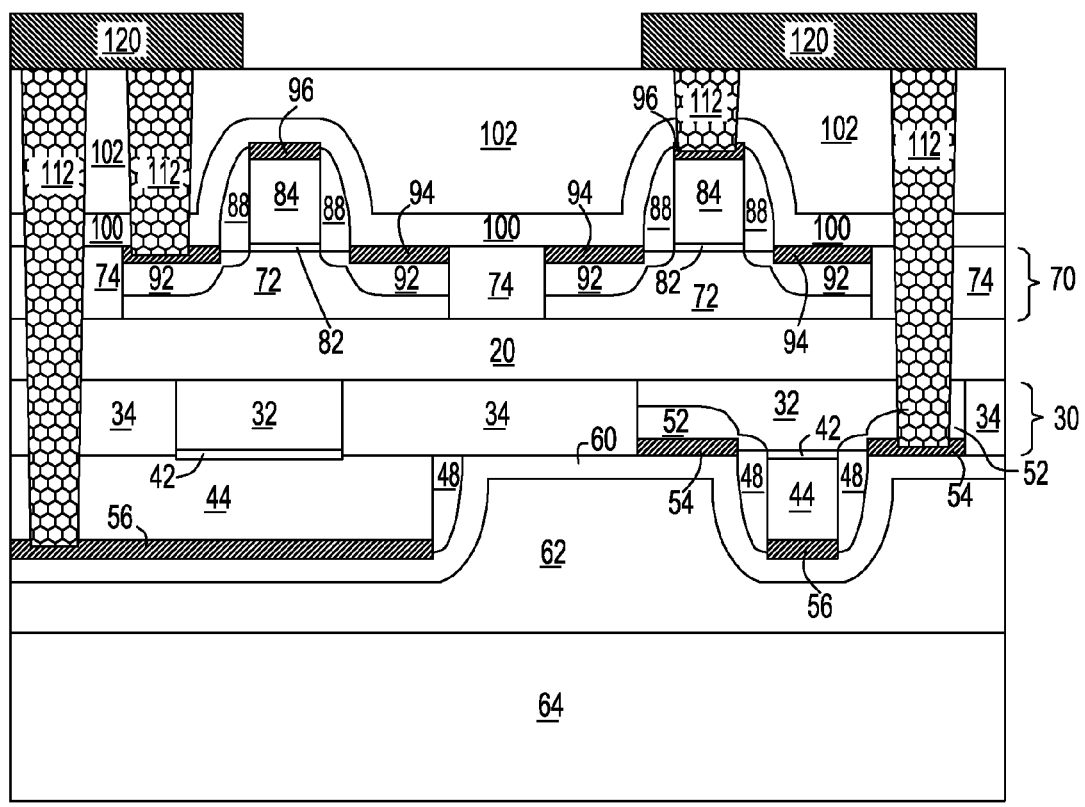

Referring to FIG. 13, via holes are formed through at least the second MOL dielectric layer 102 and filled with a conductive material to form conductive vias 112. Preferably, at least one conductive via 112 is formed through the buried insulator layer 20 to connect both sides of the buried insulator layer 20 electrically. The top of the conductive vias is coincident with the top surface of the second MOL dielectric layer 102. The bottom of the conductive vias may be located within or on a second gate silicide 96, within or on a second source and drain silicide 94, within or on a first source and drain silicide 54, or within or on a first gate silicide 56. A conductive via 112 that connects a first type MOSFET and a second type MOSFET spans the second MOL dielectric layer 102, the second semiconductor layer 70, the buried insulator layer 20, and the first semiconductor layer 30 and may or may not span the first MOL dielectric layer 62. Preferably, at least one metal wiring 120 is formed on top of the conductive vias 112 such that the at least one metal wiring contacts the conductive vias 112 and the second MOL dielectric layer 102.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of manufacturing a semiconductor structure comprising:
    providing a semiconductor-on-insulator (SOI) substrate with a carrier substrate, a buried insulator layer, and a first semiconductor layer;
    forming at least one first type MOSFET on said first semiconductor layer;
    forming a first stress liner directly on said at least one first type MOSFET, wherein said first stress liner applies a first stress to a first channel of said at least one first type MOSFET;
    forming a first middle-of-line (MOL) dielectric layer on said at least one first type MOSFET;
    bonding a handle wafer on said first MOL dielectric layer;
    removing a lower portion of said carrier substrate and exposing a second semiconductor layer;
    forming at least one second type MOSFET on said second semiconductor layer, wherein said at least one first type MOSFET and said at least one second type MOSFET are at least one p-type MOSFET and at least one n-type MOSFET, respectively, or said at least one first type MOSFET and said at least one second type MOSFET are at least one n-type MOSFET and at least one p-type MOSFET; and
    forming a second stress liner directly on said at least one second type MOSFET, wherein said second stress liner applies a second stress to a second channel of said at least one second type MOSFET, wherein said first stress and said second stress are a compressive stress and a tensile stress, respectively, or a tensile stress and a compressive stress, respectively.

2. The method of claim 1, further comprising:
    forming a second middle-of-line (MOL) dielectric layer on said at least one second type MOSFET; and
    forming at least one conductive via through said second MOL dielectric layer, through said second semiconductor layer, and through said buried insulator layer.

3. The method of claim 2, further comprising forming at least one metal wiring that contacts said at least one conductive via and said second MOL dielectric layer.

4. The method of claim 1, further comprising:
    forming at least one alignment mark at least within said first semiconductor layer; and
    aligning said second semiconductor layer utilizing said at least one alignment mark.

5. The method of claim 4, further comprising forming said at least one alignment mark within said second semiconductor layer.

6. The method of claim 1, further comprising:
    forming at least one first gate electrode in said at least one first type MOSFET; and
    forming at least one second gate electrode in said at least one second type MOSFET, wherein said at least one first gate electrode and at least one second gate electrode comprise different materials.

7. The method of claim 1, wherein said first semiconductor layer and said second semiconductor layer have different surface orientations.

8. The method of claim 1, further comprising:
    forming a first shallow trench isolation including a first dielectric material within said first semiconductor layer, wherein said first shallow trench isolation applies a stress to a first active area in said top semiconductor layer; and
    forming a second shallow trench isolation including a second dielectric material within said second semiconductor layer, wherein said first dielectric material and said second dielectric material are different, and said second shallow trench isolation applies another stress to a second active area in said bottom semiconductor layer, and wherein said stress and said other stress are a compressive stress and a tensile stress, respectively, or a tensile stress and a compress stress, respectively.

9. The method of claim 1, further comprising:
    forming first source and drain regions comprising a first embedded material in said first semiconductor layer, wherein said first source and drain regions constitute portions of said at least one first type MOSFET; and
    forming second source and drain regions comprising a second embedded material in said second semiconductor layer, wherein said second source and drain regions constitute portions of said at least one second type MOSFET, and wherein said first embedded material is different from said second embedded material.

10. The method of claim 1, further comprising:
forming at least one first gate electrode on said first semiconductor layer, wherein said at least one first electrode constitutes a portion of said at least one first type MOSFET; and
forming at least one second gate electrode on said second semiconductor layer, wherein said at least one second electrode constitutes a portion of said at least one second type MOSFET, and wherein said at least one first gate electrode and said at least one second gate electrode comprise different materials.

11. A method of manufacturing a semiconductor structure comprising:
providing a semiconductor-on-insulator (SOI) substrate with a cater substrate, a buried insulator layer, and a first semiconductor layer;
forming at least one first type MOSFET on said first semiconductor layer;
forming a first stress liner directly on said at least one first type MOSFET, wherein said first stress liner applies a first stress to said at least one first type MOSFET;
forming a first middle-of-line (MOL) dielectric layer on said at least one first type MOSFET;
bonding a handle wafer on said first MOL dielectric layer;
removing a lower portion of said carrier substrate and exposing a second semiconductor layer;
forming at least one second type MOSFET on said second semiconductor layer, wherein said at least one first type MOSFET and said at least one second type MOSFET are at least one p-type MOSFET and at least one n-type MOSFET, respectively, or said at least one first type MOSFET and said at least one second type MOSFET are at least one n-type MOSFET and at least one p-type MOSFET; and
forming a second stress liner directly on said at least one second type MOSFET, wherein said second stress liner applies a second stress to said at least one second type MOSFET, and wherein a compressive stress is applied to said at least one p-type MOSFET and a tensile stress is applied to said at least one n-type MOSFET.

12. The method of claim 11, further comprising:
forming a second middle-of-line (MOL) dielectric layer on said at least one second type MOSFET; and
forming at least one conductive via through said second MOL dielectric layer, through said second semiconductor layer, and through said buried insulator layer.

13. The method of claim 12, further comprising forming at least one metal wiring that contacts said at least one conductive via and said second MOL dielectric layer.

14. The method of claim 11, further comprising:
forming at least one alignment mark at least within said first semiconductor layer; and
aligning said second semiconductor layer utilizing said at least one alignment mark.

15. The method of claim 11, further comprising:
forming at least one first gate electrode in said at least one first type MOSFET; and
forming at least one second gate electrode in said at least one second type MOSFET, wherein said at least one first gate electrode and at least one second gate electrode comprise different materials.

16. The method of claim 11, wherein said first semiconductor layer and said second semiconductor layer have different surface orientations.

17. The method of claim 11, further comprising:
forming a first shallow trench isolation including a first dielectric material within said first semiconductor layer, wherein said first shallow trench isolation applies a stress to a first active area in said top semiconductor layer; and
forming a second shallow trench isolation including a second dielectric material within said second semiconductor layer, wherein said first dielectric material and said second dielectric material are different, wherein said second shallow Wench isolation applies another stress to a second active area in said bottom semiconductor layer, and wherein said stress and said other stress are a compressive stress and a tensile stress, respectively, or a tensile stress and a compress stress, respectively.

18. The method of claim 11, further comprising:
forming first source and drain regions comprising a first embedded material in said first semiconductor layer, wherein said first source and drain regions constitute portions of said at least one first type MOSFET; and
forming second source and drain regions comprising a second embedded material in said second semiconductor layer, wherein said second source and drain regions constitute portions of said at least one second type MOSFET, and wherein said first embedded material is different from said second embedded material.

19. The method of claim 11, further comprising:
forming at least one first gate electrode on said first semiconductor layer, wherein said at least one first electrode constitutes a portion of said at least one first type MOSFET; and
forming at least one second gate electrode on said second semiconductor layer, wherein said at least one second electrode constitutes a portion of said at least one second type MOSFET, and wherein said at least one first gate electrode and said at least one second gate electrode comprise different materials.

20. A method of manufacturing a semiconductor structure comprising:
providing a semiconductor-on-insulator (SOI) substrate with a carrier substrate, a buried insulator layer, and a first semiconductor layer;
forming a first shallow trench isolation including a first dielectric material within said first semiconductor layer, wherein said first shallow trench isolation applies a stress to a first active area in said top semiconductor layer;
forming at least one first type MOSFET on said first semiconductor layer, wherein said at least one first type MOSFET includes first source and drain regions that comprise a first embedded material;
forming at least one first gate electrode on said first semiconductor layer, wherein said at least one first electrode constitutes a portion of said at least one first type MOSFET;
forming a first stress liner directly on said at least one first type MOSFET, wherein said first stress liner applies a first stress to said at least one first type MOSFET;
forming a first middle-of-line (MOL) dielectric layer on said at least one first type MOSFET;
bonding a handle wafer on said first MOL dielectric layer;
removing a lower portion of said carrier substrate and exposing a second semiconductor layer; and
forming a second shallow trench isolation including a second dielectric material within said second semiconductor layer, wherein said first dielectric material and said second dielectric material are different, wherein said second shallow trench isolation applies another stress to a second active area in said bottom semiconductor layer, and wherein said stress and said other stress are a compressive stress and a tensile stress, respectively, or a tensile stress and a compress stress, respectively;

forming at least one second type MOSFET on said second semiconductor layer, wherein said at least one second type MOSFET includes second source and drain regions that comprise a second embedded material that is different from said first semiconductor material, and wherein said at least one first type MOSFET and said at least one second type MOSFET are at least one p-type MOSFET and at least one n-type MOSFET, respectively, or said at least one first type MOSFET and said at least one second type MOSFET are at least one n-type MOSFET and at least one p-type MOSFET;

forming at least one second gate electrode on said second semiconductor layer, wherein said at least one second electrode constitutes a portion of said at least one second type MOSFET, and wherein said at least one first gate electrode and said at least one second gate electrode comprise different materials; and forming a second stress liner directly on said at least one second type MOSFET, wherein said second stress liner applies a second stress to said at least one second type MOSFET, and wherein a compressive stress is applied to said at least one p-type MOSFET and a tensile stress is applied to said at least one n-type MOSFET.

* * * * *